United States Patent

Oswald et al.

[11] Patent Number: 5,570,039
[45] Date of Patent: Oct. 29, 1996

[54] PROGRAMMABLE FUNCTION UNIT AS PARALLEL MULTIPLIER CELL

[75] Inventors: William A. Oswald, Allentown; Satwant Singh, Macungie, both of Pa.

[73] Assignee: Lucent Technologies Inc., Murray Hill, N.J.

[21] Appl. No.: 507,893

[22] Filed: Jul. 27, 1995

[51] Int. Cl.⁶ ........................ H03K 19/173; H03K 19/094
[52] U.S. Cl. ................................ 326/39; 326/44; 326/38
[58] Field of Search ................................ 326/39, 38, 44

[56] References Cited

U.S. PATENT DOCUMENTS

| Re. 34,363 | 8/1993 | Freeman | 307/465 |
|---|---|---|---|
| 4,870,302 | 9/1989 | Freeman | 307/465 |
| 5,060,183 | 10/1991 | Sakashita et al. | 364/757 |
| 5,384,497 | 1/1995 | Britton et al. | 326/44 |
| 5,386,156 | 1/1995 | Britton et al. | 326/37 |
| 5,448,186 | 9/1995 | Kawata | 326/41 |

FOREIGN PATENT DOCUMENTS

0177261B1  11/1990  European Pat. Off.  ..... H03K 19/177

OTHER PUBLICATIONS

Hamacher et al, *Computer Organization*, published by McGraw–Hill, 1978, pp. 194–195.

*Primary Examiner*—Edward P. Westin
*Assistant Examiner*—Richard Roseen
*Attorney, Agent, or Firm*—James H. Fox

[57] ABSTRACT

A field programmable gate array (FPGA) includes at least one programmable function unit (PFU) which comprises input lines, output lines, and a look-up table (LUT) for generating various functions in response to a configuration bit stream. A first function is an adder/subtracter in which the first input line provides an add/subtract control signal to a multiplexer coupled to a full-adder. The multiplexer determines whether a data bit or its complement is coupled to the full-adder. A second function is an AND gate coupled to the full-adder in which the first input line provides a data bit to the AND gate. The second function provides a basic cell for a parallel multiplier. Furthermore, the first input line may be used as a control line or a data line for a general logic function, depending on the PFU function.

26 Claims, 3 Drawing Sheets

PROGRAMMABLE FUNCTION UNIT AS PARALLEL MULTIPLIER CELL

FIELD OF THE INVENTION

The invention relates generally to programmable logic devices, and particularly to field programmable gate arrays which utilize programmable function units.

BACKGROUND OF THE INVENTION

Application-specific integrated circuits (ASICs) are designed to perform a specific function, as opposed to a microprocessor which can be programmed to perform a variety of functions. The major advantages of ASICs are typically lower unit cost and higher performance. ASICs are normally fabricated in some form of complementary metal-oxide semiconductor (CMOS) technology using custom, standard cell, physical placement of logic (PPL), gate array, or field programable gate array (FGPA) design.

Gate arrays and FPGAs are semi-custom devices which contain a fixed set of gate structures which may be interconnected in a number of ways to achieve a desired logic function. In gate arrays the interconnect pattern is defined by the manufacturer using customized process masks. In FPGAs the interconnect pattern is programmed electrically by the user.

FPGAs generally include an array of programmable function units (PFUs). A PFU may also be called a configurable logic block (CLB) or a configurable logic element (CLE). Each PFU is a small programmable logic block which often includes one or more input lines, one or more output lines, one or more latches, and one or more look-up table (LUTs). There are usually a greater number of input lines than output lines, with each input line being either a dedicated data line or a dedicated control line. The LUT can be programmed to perform various functions including general combinatorial or control logic, read only memory (ROM), random access memory (RAM), or data path functions between the input and output lines. In this manner, the LUT determines whether the respective PFU performs general logic, or a special mode such as an adder, a subtracter, a counter, an accumulator, a register, or a memory cell such as single-port ROM or a single-port RAM. In some instances, the LUT can be used relatively independently of the latches. FPGAs typically contain on the order of 100–1000 essentially identical PFUs.

FPGAs also include a programmable interconnection network that surrounds the PFUs. The interconnection network includes programmable crosspoint switches and metal interconnect segments (routing nodes) for selectively coupling various PFUs. The crosspoint switches are also called programmable interconnect points (PIPs). The crosspoint switches provide signal switching, amplification, and isolation. The metal interconnect segments may be arranged symmetrically about the FPGA's horizontal and vertical axis.

The function of the FPGA is determined by the combined programming of the PFUs and the interconnection network. The user selects the FPGA function by loading a configuration bit stream into the FGPA at power-up or under system control to accomplish this combined programming. Various bits of the configuration bit stream are stored in the FPGA's internal configuration RAM. The configuration RAM is coupled to the LUTs and to the crosspoint switches. Therefore, the configuration bit stream determines the specific function for each PFU as well as the interconnections between the input and output lines of various PFUs, external bonding pads, and other circuitry in the FPGA. The configuration bit stream may initially reside in an electrically erasable programmable ROM (EEPROM), a ROM on a circuit board, or any other storage medium external to the FPGA.

FPGAs may also be defined in terms of programmable logic cells (PLCs) and programmable input-output cells (PICs). The PLCs contain the PFUs, various configuration RAM, and portions of the interconnect network that couple to the PFUs. Thus, various logic functions are performed in the PLCs. The PICs are located at the perimeter of the device, outside the PLCs. The PICs contain input-output buffers, various configuration RAM, and portions of the interconnect network that couple to the bonding pads. Each PIC, for instance, may contain four buffers for interfacing with four bonding pads. Each buffer may be configured as an input, an output, or a bi-directional input- output. Each buffer may also be configured as TTL or CMOS compatible.

FPGAs are further described in U.S. Pat. Nos. 5,386,156; 5,384,497; 4,870,302; U.S. Pat. No. reissue 34,363; and European Patent Specification Publication No. 0 177 261 B 1; which are all incorporated herein by reference.

Binary multiplication is one of many logic functions that can be implemented in an FPGA. In the binary system, a multiplicand is multiplied by each bit of a multiplier to form a product. If a multiplier bit is "1", the multiplicand is entered in an appropriately shifted position. If the multiplier bit is "0", then "0"s are entered. The appropriately shifted multiplicands are added to form the product.

Parallel multipliers (also called array multipliers) are used for performing binary multiplication. Referring to FIGS. 1 and 2, a conventional parallel multipier 2 typically contains a two-dimensional logic array of cells 4. Multiplying an M-bit multiplicand by an N-bit multiplier is accomplished by M×N cells arranged in N rows of M cells. The rows are shifted left by one cell with respect to the row immediately above, and the multiplicand is shifted left one cell per row by a diagonal signal path. The "basic cell" of a parallel multiplier, as used herein, includes an AND gate 6 coupled to a full-adder 8. The AND gate receives one bit of the multiplicand and one bit of the multiplier, and generates a product of these bits. The output of the AND gate is coupled to an input of the full-adder. The full-adder adds the bit product from the AND gate to a carry-in bit and to an incoming partial-product bit to produce a sum bit and a carry-out bit. Therefore, the AND gate determines whether or not a multiplicand bit is added to the incoming partial-product bit, based on the value of the multiplier bit for that row. If the multiplier bit for the row is "1", the array adds the multiplicand (appropriately shifted) to the incoming partial-product to generate the outgoing partial-product. If the multiplier bit for the row is "0", the incoming partial-product is passed vertically downward unchanged. Parallel multipliers utilizing the basic cell are well known in the art; see, for instance, Hamacher et al., *Computer Organization,* published by McGraw-Hill, 1978, pp. 194–195, which is incorporated herein by reference.

Many schemes exist for parallel multipliers. Every cell of a parallel multiplier need not necessarily be the basic cell. For instance, the right-most cells of each row may replace the full-adder with a half-adder with no carry-in bit received. Or, the upper row cells may replace the full-adder with a half-adder with no partial-product bit received. Nevertheless, usually at least one, if not a substantial number of cells, is the basic cell. Furthermore, a parallel multiplier may use the basic cell for each cell, setting the carry-in bit of the right-most cells to "0", and setting the partial-product bit of the upper row cells to "0".

A primary shortcoming and deficiency with conventional FPGAs is that individual PFUs are normally incapable of providing the basic cell of a parallel multiplier. As a result, two PFUs are normally required to implement the basic cell, with one PFU functioning as the AND gate and the other PFU functioning as the full-adder. The need for additional PFUs creates several disadvantages. First, the demand for hardware and chip area is increased. Secondly, additional time delays arise during operation. For example, signals between the PFUs are often delayed by source-to-gate and drain-to-gate capacitances in the n-channel FET crosspoint switches of the interconnection network. Accordingly, there is a need for an FPGA which efficiently implements a parallel multiplier.

SUMMARY OF THE INVENTION

A primary aspect of the invention is an FPGA in which a single PFU can be programmed to function as a basic cell for a parallel multiplier.

In accordance with one aspect Of the invention, a single PFU comprises input lines, output lines, and a LUT for generating various functions in response to a configuration bit stream. A first function is an adder/subtracter in which a first input line provides an add/subtract control signal to a multiplexer coupled to a full-adder. The multiplexer determines whether a data bit or its complement is applied to the full-adder. A second function is an AND gate coupled to the full-adder in which the first input line provides a data bit to the AND gate. The second function provides a basic cell for a parallel multiplier.

In accordance with a more general aspect of the invention, illustrated by the basic cell for a parallel multiplier, a first input line of the PFU is used as a control line or a data line for general logic functions, depending on the PFU function.

BRIEF DESCRIPTION OF THE DRAWING

The invention, together with its various features and advantages, can be readily understood from the following detailed description taken in conjunction with the accompanying drawing, in which.

DETAILED DESCRIPTION

Figure 1:
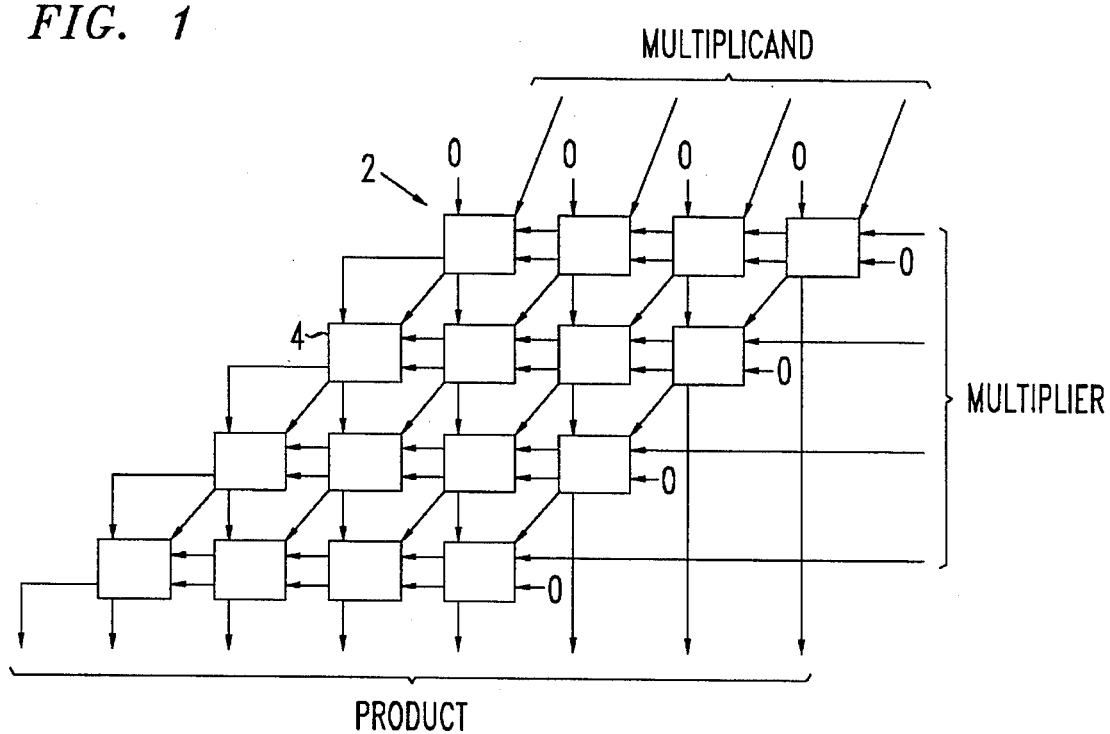
FIG. 1 is a simplified schematic diagram illustrating a conventional parallel multiplier.
Figure 2:
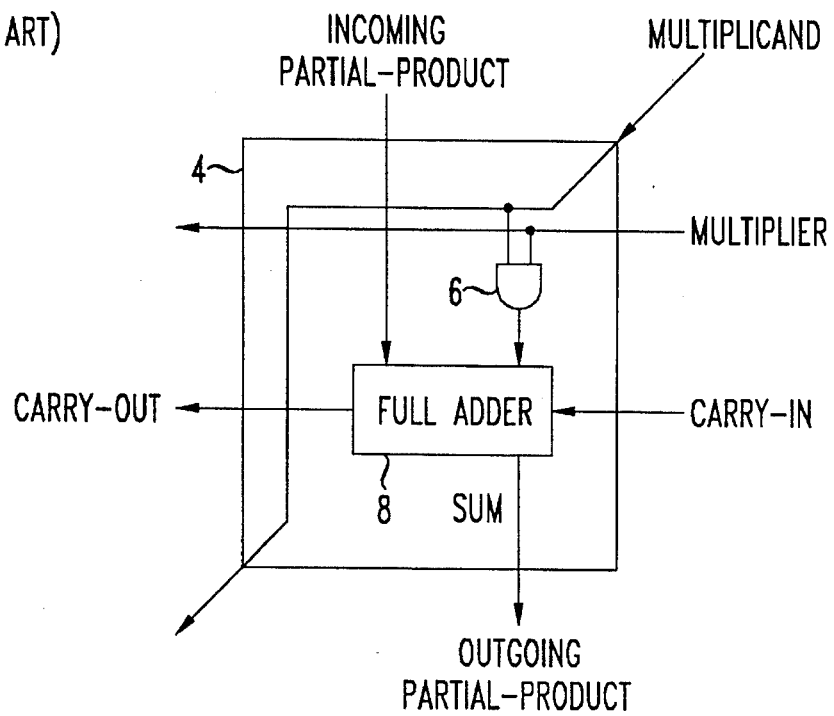
FIG. 2 is a simplified schematic diagram illustrating a conventional cell in the parallel multiplier of FIG. 1.
Figure 3:
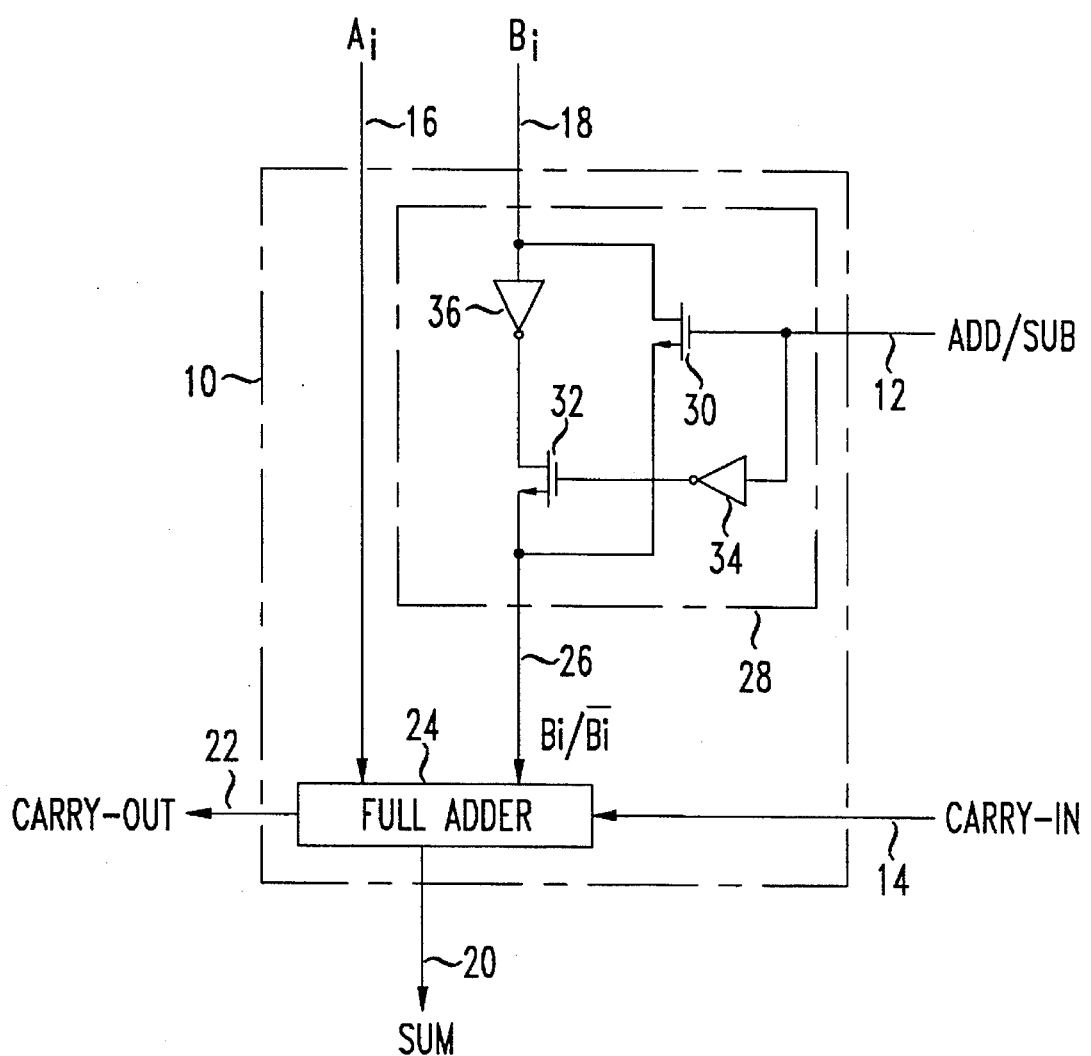
FIG. 3 is a simplified schematic diagram illustrating a prior art PFU which functions as an adder/subtracter.

Referring to FIG. 3, there is shown a simplified schematic diagram of a prior art PFU which functions as an adder/subtracter (i.e. adder or subtracter depending on the state of an add/subtract control signal). PFU 10 supports six special mode functions: add, subtract, add/subtract, count-up, count-down, and count-updown. These functions are selectable through three configuration RAMs (not shown): ASMODE, COUNTMODE, and SUBMODE. A portion of a configuration bit stream determines the contents of the configuration RAMs to select any one of the six special mode functions. For illustration purposes, the add/subtract function is selected by the configuration bit stream.

PFU 10 includes input lines 12, 14, 16 and 18, and output lines 20 and 22. A configuration bit stream places PFU 10 in an add/subtract mode. Input line 12 receives an ADD/SUB control signal for selecting whether the PFU functions as an adder or a subtracter. Input line 14 receives a carry-in bit. Input line 16 receives a data bit $A_i$ from data signal A, and input line 18 receives a data bit $B_i$ from data signal B. Full-adder 24 adds the signals at input line 14, input line 16 and internal line 26 to produce a sum bit at output line 20 and a carry-out bit at output line 22. The operation and combinatorial logic for full-adders is well known in the art; see, for instance, Hamacher et al., supra, at pp. 184–185. If PFU 10 functions as an adder, then full-adder 24 adds $A_i$ to $B_i$. If PFU 10 functions as a subtracter, then full-adder 24 adds $A_i$ to the complement of $B_i$, thereby subtracting $B_i$ from $A_i$. Multiplexer 28 couples either $B_i$ or its complement through internal line 26 to full-adder 24. In particular, the ADD operation is selected by setting the ADD/SUB control signal to HIGH, and the SUBTRACT operation is selected by setting the ADD/SUB control signal to LOW. When ADD/SUB is HIGH, transistor 30 turns on to couple $B_i$ at line 18 to internal line 26 coupled to full-adder 24. In addition, transistor 32 turns off due to inverter 34. When ADD/SUB is LOW, transistor 30 turns off and inverter 34 turns on transistor 32. As a result, transistor 32 couples the complement of $B_i$, produced by inverter 36, to internal line 26 coupled to full-adder 24. Full-adder 24 and multiplexer 26 may be implemented by a 4-input, 2-output LUT (not shown) in PFU 10.

Unfortunately, PFU 10 is incapable of functioning as a basic cell of a parallel multiplier since PFU 10 lacks an AND gate coupled to full-adder 24. It should also be noted that each of the input lines in PFU 10 are dedicated either to control or data. That is, for any function performed by PFU 10, input line 12 is a dedicated control line, whereas input lines 14, 16 and 18 are dedicated data lines.

Figure 4:
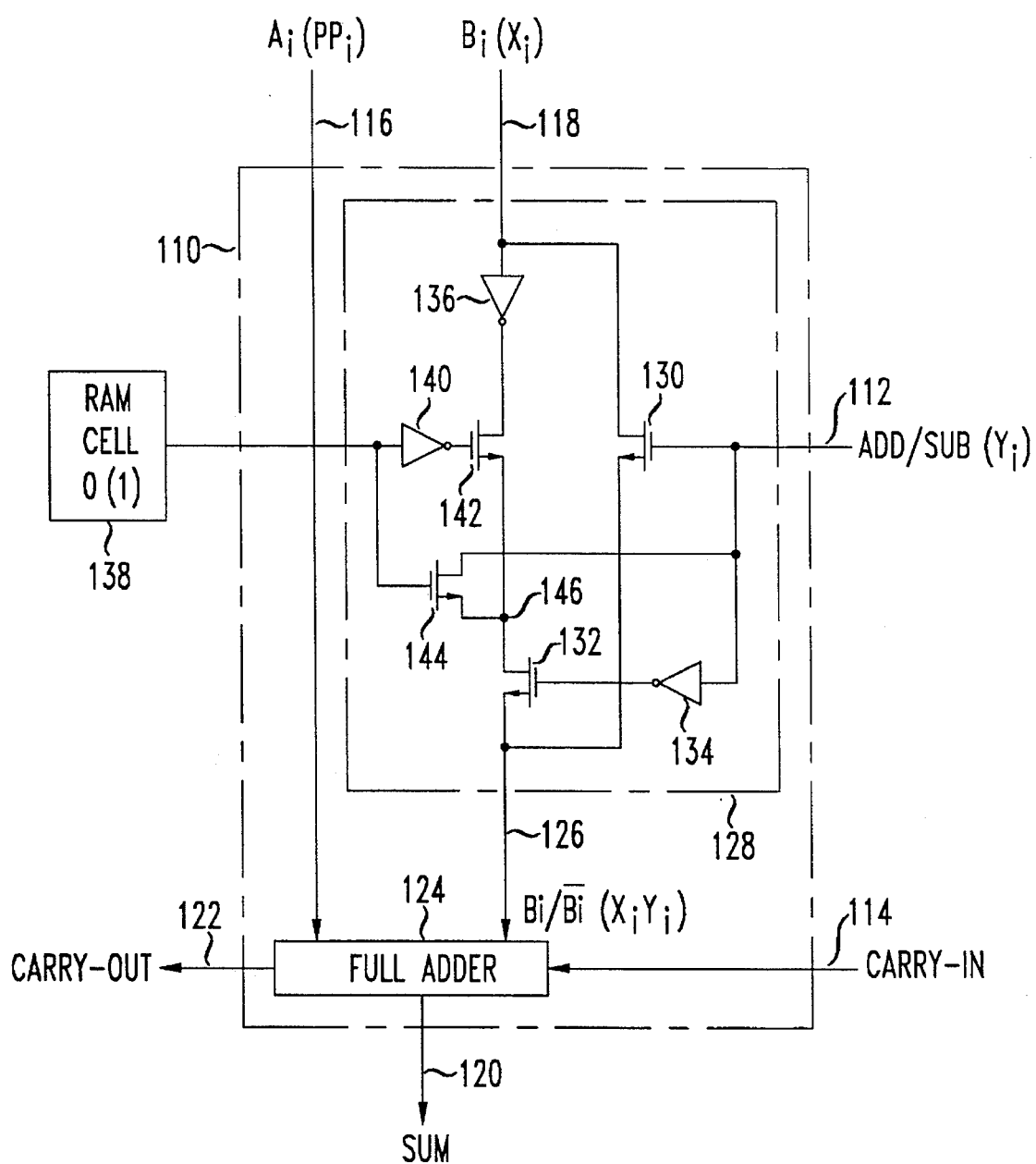
FIG. 4 is a simplified schematic diagram illustrating a PFU which functions as a basic cell for a parallel multiplier in accordance with an embodiment of the invention.

Referring to FIG. 4, there is shown a simplified schematic diagram of a PFU in accordance with an embodiment of the invention. PFU 110 is also part of an FPGA fabricated as an integrated circuit, such as a semiconductor chip. PFU 110 includes the essential features of PFU 10, as well as key additional features. As is shown, PFU 110 includes input lines 112, 114, 116 and 118, output lines 120 and 122, and full-adder 124. PFU 110 also includes logic block 128, which includes additional circuitry not present in multiplexer 28. Full-adder 124 and logic block 128 may be implemented by an LUT (not shown) in PFU 110. In addition, PFU 110 is coupled to configuration RAM cell 138 in the FPGA ( and preferably in the PLC) which embodies PFU 110. RAM cell 138 receives a particular bit from a configuration bit stream which is applied to the FPGA. The particular bit stored in RAM cell 138 may be "0" (representing LOW) or "1" (representing HIGH). The logic state of the particular bit in RAM cell 138 determines whether PFU 110 functions as an adder/subtracter or as a basic cell of a parallel multiplier. In FIG. 4, the input signals associated with a "0" particular bit are shown without parenthesis, whereas the input signals associated with a "1" particular bit are shown parenthetically. For example, with a "0" particular bit the signal received at input line 116 is $A_i$, whereas with a "1" particular bit the signal received at input line 116 is shown parenthetically as $PP_i$. The output signals generated by PFU 110 at output lines 120 and 122 are a sum bit and carry-out bit, respectively, for both "0" and "1" particular bits.

When the particular bit in RAM cell 138 is set to "0", PFU 110 functions as an adder/subtracter in a similar manner to PFU 10. The "0" at RAM cell 138 sends a LOW signal to the input of inverter 140 and to the gate of transistor 144. This turns off transistor 144 and turns on transistor 142. As a result, when ADD/SUB at line 112 is HIGH, transistor 130 turns on to couple $B_i$ at line 118 to internal line 126 coupled to full-adder 124. In addition, transistor 132 turns off due to inverter 134. When ADD/SUB is LOW, transistor 130 turns off and inverter 134 turns on transistor 132 to couple the complement of $B_i$, produced by inverter 136, through internal line 126 to full-adder 124.

When the particular bit in RAM cell 138 is set to "1", PFU 110 functions as a basic cell for a parallel multiplier. In particular, logic block 128 functions as an AND gate which is coupled to full-adder 124 by internal line 126. In this mode, input line 118 is coupled to bit $X_i$ of multiplicand data signal X, input line 112 is coupled to bit $Y_i$ of multiplier data signal Y, and input line 116 is coupled to bit $PP_i$ of the applicable partial-product. It should be noted that input line 112 now receives a data signal, instead of the ADD/SUB control signal.

Accordingly, when the particular bit in RAM cell 138 is set to "1", logic block 128 performs an AND function with respect to bits $X_i$ and $Y_i$. The "1" at RAM cell 138 provides a HIGH signal to the input of inverter 140 and to the gate of transistor 144. This turns on transistor 144 and turns off transistor 142. Since transistor 142 is turned off, the output of inverter 136 is decoupled from line 126. If $X_i$ and $Y_i$ are both LOW, transistor 130 turns off and transistor 132 turns on, transistor 144 couples the LOW signal at line 112 to node 146, and transistor 132 couples the LOW signal at node 146 to line 126. If $X_i$ is LOW and $Y_i$ is HIGH, transistor 130 turns on and transistor 132 turns off, transistor 132 decouples node 146 from line 126, and transistor 130 couples the LOW signal at line 118 to line 126. If $X_i$ is HIGH and $Y_i$ is LOW, transistor 130 turns off and transistor 132 turns on, transistor 130 decouples line 118 from line 126, transistor 144 couples the LOW signal at line 112 to node 146, and transistor 132 couples the LOW signal at node 146 to line 126. Finally, if $X_i$ and $Y_i$ are both HIGH, transistor 130 turns on and transistor 132 turns off, and transistor 130 couples the HIGH signal at line 118 to line 126. Accordingly, logic block 128 implements an AND gate and couples the product of $X_iY_i$ to full-adder 124.

With the teachings of the invention, PFU 10 can be upgraded to PFU 110 with relatively little additional hardware. For example, a PFU 10 containing several thousand FETs can be upgraded to a PFU 110 by adding only approximately 14 additional FETs. This constitutes a relatively small increase in the number of FETs. Moreover, PFU 110 allows an FPGA to furnish a parallel multiplier with a significant reduction (up to approximately 50%) in chip area, and a significant reduction in time delays during parallel multiplication. As a result, PFU 110 provides for a highly efficient implementation of a parallel multiplier in an FPGA.

Other variations of the invention will be apparent to those skilled in the art. For example, one or more input lines and/or output lines of a PFU may be used individually for both control signals and data signals when different PFU functions are selected by a configuration bit stream. Data signals X and Y may be switched with respect to the multiplicand and the multiplier, and PFU 110 can provide any single cell (i.e., for bits $X_2$ and $Y_2$, for bits $X_1$ and $Y_4$, etc.) of a parallel multiplier. Although RAM cell 138 is shown as a separate cell receiving a particular bit from the configuration bit stream, it is understood that the configuration RAMs mentioned above could be decoded to provide the function selecting logic signal provided by RAM cell 138. Other programmable elements besides an LUT may be used. Furthermore, a given FPGA may include both PFU 10 and PFU 110. If first and second configuration bit streams are sequentially applied, PFU 110 may first function as an adder/subtracter, and later function as a basic cell of a parallel multiplier. Likewise, a configuration bit stream may program first and second PFUs 110 so that the first PFU functions as an adder/subtracter while the second PFU functions as the basic cell. The portions of the configuration bit stream applied to the first and second PFUs may differ by only the value of a single bit. A method of making an M×N cell parallel multiplier for multiplying an M-bit multiplicand by an N-bit multiplier using M×N PFUs in an FPGA is apparent from the foregoing.

Having described the preferred embodiments of this invention, it will now be apparent to one of ordinary skill in the art that other embodiments incorporating the concept may be used. Therefore, this invention should not be limited to the disclosed embodiments, but rather should be limited only by the spirit and scope of the appended claims.

The invention claimed is:

1. An integrated circuit including a field programmable gate array (FPGA) which includes a programmable function unit (PFU), the programmable function unit comprising:

an input line;

an output line; and a programmable element for generating at least first and second functions in response to a configuration bit stream, in which the input line provides a control line to the programmable element when the first function is generated, and the input line provides a data line to the programmable element when the second function is generated; and wherein the programmable element is a look-up table.

2. The integrated circuit of claim 1 in which the first and second functions are different logic functions.

3. The integrated circuit of claim 2, in which the first function is an adder/subtracter and the control line provides the programmable element with a control signal for selecting between addition and subtraction, and the second function is an AND gate coupled to an adder and the data line provides the programmable element with a data bit.

4. The integrated circuit of claim 3 in which the AND gate coupled to the adder provides a single cell for a parallel multiplier implemented by the field programmable gate array.

5. An integrated circuit including a field programmable gate array (FPGA), the field programmable gate array including a plurality of programmable function unit (PFUs) and a programmable interconnection network for selectively coupling the programmable function units, in which at least one programmable function unit comprises:

a plurality of input lines;

a plurality of output lines; and a look-up table (LUT) for generating a selected one of a plurality of functions including first and second functions in response to a configuration bit stream, in which the first input line provides a control signal to the look-up table when the first function is generated, and the first input line provides a data signal to the look-up table when the second function is generated.

6. The integrated circuit of claim 1, in which
the programmable function unit provides an adder/subtracter and the control signal selects between addition and subtraction when the first function is generated, and the programmable function unit provides a cell including an AND gate coupled to a full-adder for use in a parallel multiplier implemented by the field programmable gate array when the second function is generated.

7. An integrated circuit including a field programmable gate array (FPGA), the field programmable gate array including a plurality of programmable function unit (PFUs) and a programmable interconnection network for selectively coupling the programmable function units, the programmable function units and interconnection network programmable by a configuration bit stream, in which at least one programmable function unit comprises:

a plurality of input lines including first, second, third and fourth input lines;

a plurality of output lines including first and second output lines; and a look-up table (LUT) for generating a selected one of a plurality of functions, including first and second functions, between selected input and output lines, in response to the configuration bit stream;

such that when the first function is generated, the look-up table implements an adder/subtracter with the first input line receiving a control signal which selects between addition and subtraction, the second input line receiving a carry-in bit, the third input line receiving a data bit from a first data signal, the fourth input line receiving a data bit from a second data signal, the first output line providing a sum bit, and the second output line providing a carry-out bit; and such that when the second function is generated, the look-up table implements a single cell for a parallel multiplier configured to multiply a third data signal by a fourth data signal, with the first input line receiving a data bit from the third data signal, the second input line receiving the carry-in bit, the third input line receiving a data bit from a partial-product, the fourth input line receiving a data bit from the fourth data signal, the first output line providing the sum bit, and the second output line providing the carry-out bit.

8. The integrated circuit of claim 7, in which
when the first function is generated, the look-up table implements a multiplexer coupled by an internal line to a full-adder, such that when the control signal selects addition then the multiplexer couples the data bit from the first data signal through the internal line to the full-adder, and when the control signal selects subtraction then the multiplexer couples a complement of the data bit from the first data signal through the internal line to the full-adder, and when the second function is generated the look-up table implements an AND gate coupled by the internal line to the full-adder, such that the AND gate couples a product of the data bit from the third data signal and the data bit of the fourth data signal through the internal line to the full-adder.

9. The integrated circuit of claim 8 in which full-adder adds the carry-in bit to a bit at the third input line and to a bit at the internal line to produce the sum bit and the carry-out bit.

10. The integrated circuit of claim 9 in which the look-up table is coupled to a RAM cell in the field programmable gate array, and a value of a particular bit determined by the configuration bit stream and stored in the RAM cell instructs the look-up table to select one of the first and second functions.

11. An integrated circuit including a field programmable gate array (FPGA), the field programmable gate array including a plurality of programmable function unit (PFUs) and a programmable interconnection network for selectively coupling the programmable function units, the programmable function units and interconnection network programmable by a configuration bit stream applied to the field programmable gate array, in which at least one programmable function unit comprises:

a plurality of input lines including first, second, third and fourth input lines;

a plurality of output lines including first and second output lines; and a look-up table (LUT) for generating a selected one of a plurality of functions, including first and second functions, between selected input and output lines, in response to the configuration bit stream;

the first function providing a multiplexer coupled to a full-adder for providing addition and subtraction;

the second function providing an AND gate coupled to the full-adder for providing a single cell of a parallel multiplier.

12. The integrated circuit of claim 11, in which
the look-up table generates the first and second functions by implementing a logic circuit coupled to a full-adder, the full adder receiving a first input from the third input line, a second input from the second input line, and a third input from the logic circuit, the full-adder sending a first output representing a sum bit to the first output line, and a second output representing a carry-out bit to the second output line.

13. The integrated circuit of claim 12, in which the logic circuit consists essentially of a first transistor, a second transistor, a third transistor, a fourth transistor, a first inverter, a second inverter, and a third inverter, in which the first input line is connected to a gate of the first transistor and to a drain of the fourth transistor, the fourth input line is connected to a drain of the first transistor, the third input of the full-adder is connected to a source of the first transistor and to a source of the second transistor, the first inverter is connected between the first input line and a gate of the second transistor, the second inverter is connected between the fourth input line and a drain of the third transistor, the third inverter is connected between a RAM cell of the field programmable gate array and a gate of the third transistor, a gate of a fourth transistor is connected to the RAM cell, and a drain of the second transistor is connected to a source of the third transistor and to a source of the fourth transistor.

14. An integrated circuit including a field programmable gate array (FPGA), the field programmable gate array including a plurality of programmable function unit (PFUs) and a programmable interconnection network for selectively coupling the programmable function units, the programmable function units and network being programmable by a configuration bit stream, comprising:

a set of the programmable function units programmable to provide a parallel multiplier in which each programmable function unit in the set provides a single cell for the parallel multiplier, wherein each programmable function unit in the set is programmable to include the function of an AND gate coupled to a full-adder, with a first input line for coupling a data signal to the AND gate.

15. The integrated circuit of claim 14 in which each programmable function unit in the set is also programmable to include the function of a multiplexer coupled to the full-adder, with the first input line for coupling a control signal to the multiplexer for selectively coupling one of a data bit and its complement to the full-adder.

16. A method of programming a field programmable gate array (FPGA) including a plurality of programmable function units (PFUs) and a programmable interconnection network, comprising the steps of:

applying a first configuration bit stream to the field programmable gate array so that a first programmable function unit functions as an AND gate coupled to a full-adder; and applying a second configuration bit stream to the field programmable gate array so that the first programmable function unit functions as a multiplexer coupled to the full-adder.

17. A method of programming a field programmable gate array (FPGA) including a plurality of programmable function units (PFUs) and a programmable interconnection network, the programmable function units including first and second essentially identical programmable function units, comprising the steps of:

applying a first portion of a configuration bit stream to the first programmable function unit so that the first programmable function unit functions as an AND gate coupled to a full-adder; and applying a second portion of the configuration bit stream to the second programmable function unit so that the second programmable function unit functions as a multiplexer coupled to a full-adder.

18. The method of claim 17, in which the first and second programmable function units each comprise a plurality of input lines and output lines, the input lines including a first input line, the first input line of the first programmable function unit coupled to a first input of the AND gate for receiving a first data bit, and the first input line of the second programmable function unit coupled to the multiplexer for receiving a control signal to determine whether a second data bit or its complement is coupled to the full-adder.

19. The method of claim 17 in which the first and second portions of the configuration bit stream differ from one another by a value of a single bit 20. A method of programming and operating a field programmable gate array (FPGA) including a plurality of programmable function units (PFUs) and a programmable interconnection network, comprising the steps of:

applying a configuration bit stream for selectively coupling a set of the programmable function units so that the set is configured as a parallel multiplier with at least one programmable function unit in the set functioning as both an AND gate and a full-adder; and multiplying a multiplicand by a multiplier to form a product using the set as a parallel multiplier.

21. The method of claim 20 with each programmable function unit in the set functioning as both an AND gate and a full-adder.

22. A method making a parallel multiplier having M×N cells for multiplying an M-bit multiplicand by an N-bit multiplier, comprising the steps of:

providing a field programmable gate array (FPGA) including a plurality of programmable function units (PFUs) and a programmable interconnection network; and applying a configuration bit steam to the field programmable gate array so as to interconnect M×N programmable function units with each of the M×N programmable function units functioning as a separate parallel multiplier cell including an AND gate coupled to a full-adder.

23. An integrated circuit including a field programmable gate array (FPGA) which includes a programmable function unit (PFU), the programmable function unit comprising:

an input line;

an output line; and a programmable element for generating at least first and second functions in response to a configuration bit stream, in which the input line provides a control line to the programmable element when the first function is generated, and the input line provides a data line to the programmable element when the second function is generated; and wherein the first and second functions are different logic functions.

24. The integrated circuit of claim 23 in which the programmable element is a look-up table.

25. The integrated circuit of claim 23 in which the first function is an adder/subtracter and the control line provides the programmable element which a control signal for selecting between addition and subtraction, and the second function is an AND gate coupled to an adder and the data line provides the programmable element with a data bit.

26. The integrated circuit of claim 25 in which the AND gate coupled to the adder provides a single cell for a parallel multiplier implemented by the field programmable gate array.

* * * * *